United States Patent [19]

Reisman et al.

[11] Patent Number: 4,774,630
[45] Date of Patent: Sep. 27, 1988

[54] APPARATUS FOR MOUNTING A SEMICONDUCTOR CHIP AND MAKING ELECTRICAL CONNECTIONS THERETO

[75] Inventors: Arnold Reisman, Raleigh; Carlton M. Osburn, Cary; Lih-Tyng Hwang; Jagdish Narayan, both of Raleigh, all of N.C.

[73] Assignee: Microelectronics Center of North Carolina, Durham, N.C.

[21] Appl. No.: 781,981

[22] Filed: Sep. 30, 1985

[51] Int. Cl.⁴ .............................................. H02B 1/00
[52] U.S. Cl. .................................. 361/383; 361/386; 357/82; 174/16 HS
[58] Field of Search ............... 361/381, 382, 383, 386, 361/388, 389; 357/80, 81, 82; 174/16 HS; 165/80.3, 80.4

[56] References Cited

U.S. PATENT DOCUMENTS

| T955,008 | 2/1977 | Gregor et al. | 357/80 |
|---|---|---|---|
| 3,325,882 | 6/1987 | Chiou et al. | 29/155.5 |
| 3,428,866 | 2/1969 | Chiou et al. | |
| 3,436,604 | 4/1969 | Hyltin et al. | |
| 3,706,010 | 12/1972 | Laermer et al. | 361/382 |
| 3,871,014 | 8/1969 | King et al. | 357/67 |
| 3,871,015 | 8/1969 | Lin et al. | 357/67 |
| 3,946,428 | 3/1976 | Anazawa et al. | 357/81 X |
| 3,959,579 | 5/1967 | Johnson | 174/68.5 |
| 3,984,620 | 10/1976 | Robillard et al. | 174/52 FP |
| 3,984,739 | 10/1976 | Mochizuki et al. | 317/101 CP |
| 4,030,001 | 6/1977 | Medley, Jr. et al. | 361/401 |
| 4,092,697 | 12/1976 | Spaight | 361/386 |
| 4,150,420 | 4/1979 | Berg | 361/401 |
| 4,246,597 | 6/1979 | Cole et al. | 357/81 |
| 4,323,914 | 2/1979 | Berndlmaier et al. | 357/82 |
| 4,398,208 | 8/1983 | Marano et al. | 357/81 |
| 4,484,215 | 11/1984 | Pappas | 357/80 |
| 4,591,537 | 5/1986 | Aldinger et al. | 174/16 HS X |

OTHER PUBLICATIONS

"IC Package Assembly", J. D. Larnerd, *IBM Technical Disclosure Bulletin*, May 1978, vol. 20, No. 12, S8796-003.

*Primary Examiner*—A. D. Pellinen
*Assistant Examiner*—Derek S. Jennings
*Attorney, Agent, or Firm*—Bell, Seltzer, Park & Gibson

[57] ABSTRACT

Apparatus for mounting a semiconductor device chip and making electrical connections thereto is disclosed. A semiconductor device chip has its backside connected to the surface of a substrate, and its upper surface includes a plurality of electrical pads across the entire surface thereof. A translator chip having a plurality of first electrical contacts disposed generally across the interior portion thereof are in electrical contact with the semiconductor device chip electrical pads, and a plurality of second electrical contacts disposed generally around the perimeter of the translator chip are electrically connected with the electrical terminals in the substrate to which the chip is attached. Heat may be removed from the semiconductor device chip through its backside via cooling channels in the substrate.

20 Claims, 1 Drawing Sheet

APPARATUS FOR MOUNTING A SEMICONDUCTOR CHIP AND MAKING ELECTRICAL CONNECTIONS THERETO

FIELD OF THE INVENTION

This invention relates generally to apparatus for mounting a semiconductor device chip to achieve electrical connections with a substrate and to cool the semiconductor device chip through direct contact of the backside of the device chip with the substrate.

BACKGROUND OF THE INVENTION

A semiconductor device chip (which includes numerous semiconductor devices) was traditionally mounted with its backside or substrate against another base substrate or heat sink surface to aid in cooling the device chip, and with its electrical contact pads on the opposite side facing upward for connection to an electrical circuit. The electrical contact pads were located near the periphery of the device chip to accommodate electrical connections. The electrical connections could be made, for example, by wire bonding, metallization techniques, or devices shaped like picture frames with electrical contacts on the underside which were used to physically sandwich the semiconductor device chip onto the substrate and also make electrical contact between the electrical pads on the device chip and the electrical pads on the substrate. All of these techniques are characterized by making all electrical connections at the periphery of the semiconductor device chip. See, for example, U.S. Pat. No. 4,150,420 to Berg and U.S. Pat. No. 3,984,620 to Robillard et al.

As the density and number of elements on the semiconductor device chip increased, so to did the size of the semiconductor device chip. However, difficulties were experienced in accommodating sufficient contact pads around the perimeter of the device chip to make all of the electrical connections that were desirable between the device chip and the surrounding base substrate.

The lack of sufficient space around the perimeter of the semiconductor device chip for contact pads was solved in a design that has come to be known as the "flip chip" module. The flip chip has electrical contact pads dispersed across the entire surface of the semiconductor device chip so that electrical contacts can be made to both the interior portion of the chip surface and the perimeter of the chip surface. However, it was necessary to invert (flip) the chip so that its backside or substrate surface was up (off the substrate) and the contact pads were down (against the substrate) to make electrical and physical contact with correspondingly located electrical terminals on the substrate. See, for instance, U.S. Def. Pub. No. T955,008 to Gregor et al, and U.S. Pat. Nos. 3,871,014 to King et al and 3,871,015 to Lin et al. While this increased the number of electrical connections between the semiconductor device chip and the substrate, it seriously inhibited the ability of the semiconductor device chip to dissipate heat, thereby degrading the performance of the device chip, limiting the conditions under which it could operate, and ultimately risking irreparable destruction due to excessive heat.

Others have attempted to solve this problem of heat dissipation by attaching devices to the backside of the device chip. This has included pistons that are spring loaded against the backside of the device chip, as illustrated in U.S. Pat. No. 4,246,597 to Cole et al, electrically insulative films attached to a thermally conductive material that is attached to the backside of the device chip, as illustrated in U.S. Pat. No. 4,092,697 to Spaight, and liquid metal contained against the backside of the device chip as illustrated in U.S. Pat. No. 4,323,914 to Berndlmaier et al. Each of these proposals for cooling the device chip has met with some success, but they are also extremely complex, difficult to manufacture, require an inordinate amount of space, place undesirable physical strains on the device chip, and do not provide the desired amount of cooling.

Thus, it is an object of the present invention to provide a simple and inexpensive apparatus for mounting a semiconductor device chip and making electrical connections thereto.

It is a further object of the present invention to provide apparatus for mounting a semiconductor device chip and making electrical connections thereto with the backside of the semiconductor device chip against a substrate while making electrical connections to electrical pads across the entire contact pad surface of the semiconductor device chip.

It is a still further object of the present invention to provide apparatus for mounting a semiconductor device chip and making electrical connections to electrical pads across the entire contact pad surface of the semiconductor device chip with the backside of the device chip against a heat conductive substrate.

These and other objects are accomplished with the apparatus of the present invention for mounting a semiconductor device chip and making electrical connections thereto. A substrate has a surface with electrical terminals. A semiconductor device chip has its backside connected to the surface of the substrate, and electrical pads across its upper surface. Means for electrically connecting the substrate electrical terminals and the electrical pads of the semiconductor device chip has first electrical contacts that are electrically connected to the contact pad surface of the semiconductor chip and second electrical contacts that are connected to the electrical terminals of the substrate. The first and second electrical contacts of the means for electrically connecting are electrically connected in a predetermined circuit.

DETAILED DESCRIPTION OF THE INVENTION

Figure 1:
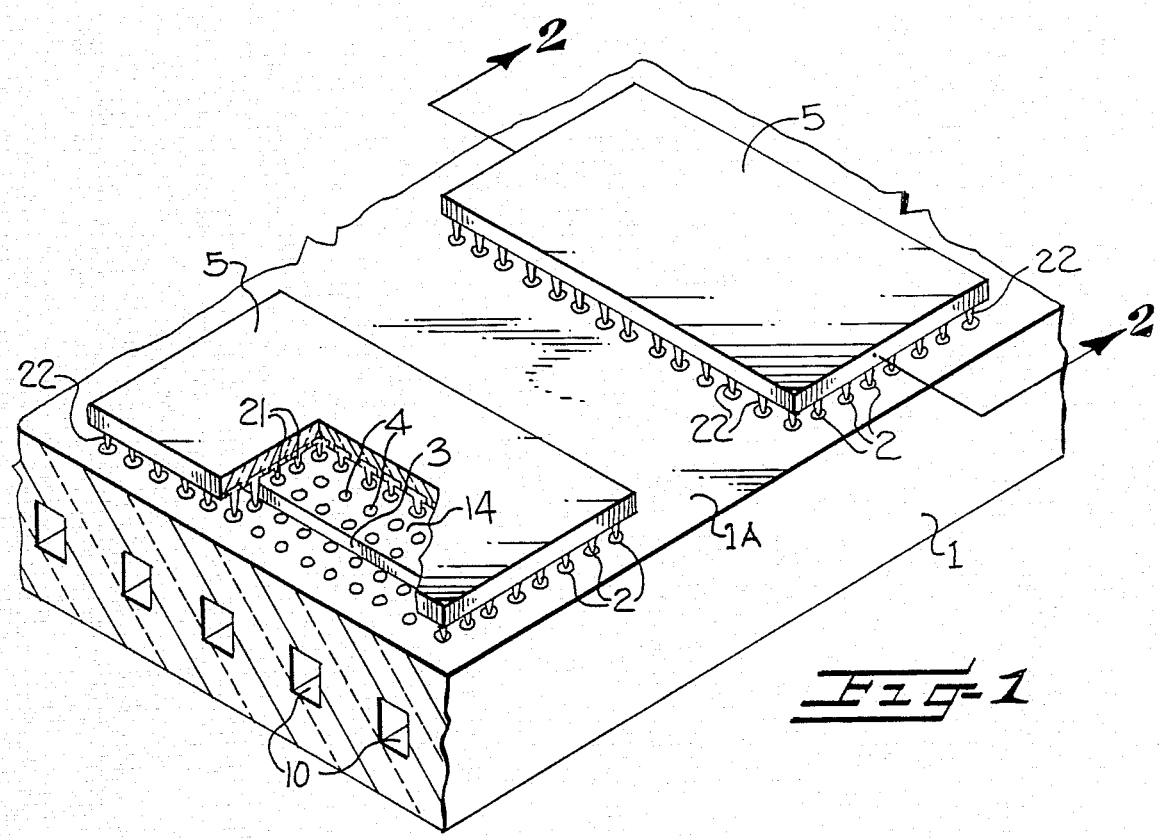
FIG. 1 is a perspective view of the present invention with a portion of the translator chip broken away to illustrate the semiconductor device chip therebelow.

FIG. 1 illustrates a substrate 1 having a plurality of electrical terminals 2 across the surface thereof. A semiconductor device chip 3 has its backside in contact with the substrate. A plurality of electrical contact pads 4 are dispersed across the entire upper surface of the semiconductor device chip, with the pads being both at the periphery and across the interior area of the upper surface of the device chip. A translator chip 5 is superposed above the semiconductor device chip 3 and has a plurality of first electrical contacts 21 that make electrical connection with the electrical pads 4 on the semiconductor device chip, and a plurality of second electrical contacts 22 that make electrical contact with the electrical terminals 2 on the substrate 1. Although not illustrated, the first electrical contacts and second electrical contacts of the translator chip are electrically interconnected in a predetermined circuit. Additional details are provided in the following paragraphs.

The substrate 1 may be the substrate for the package module, it may be of silicon, ceramic, or other material, and it may be either a single layer or multiple layers. It is desirable that the substrate have a relatively high coefficient of thermal conductivity to function as a heat sink with respect to the semiconductor device chip. For this purpose it may define one or more channels 10 through which a fluid or other coolant may be circulated to remove heat therefrom. The base substrate may consist of two wafers with the cooling channels being made by etching grooves in the surface of one wafer and placing a second wafer on top of the grooves to enclose them and form channels. See FIG. 3. It is also desirable that the substrate have thermal characteristics (e.g. thermal coefficient of conductivity, coefficient of expansion, etc.) that are similar to those of the semiconductor device chip. The upper surface of the substrate may be polished or lapped or otherwise processed to have whatever surface features are desirable. It is preferred that the substrate be relatively planar or otherwise treated to maintain a good thermal contact with the backside of the semiconductor device chip.

The substrate 1 also includes a plurality of electrical terminals 2 dispersed across the surface thereof in predetermined locations. They are exposed for electrical connection to selected terminals of the semiconductor device chip 3 through the intervening translator device 5. The electrical terminals typically surround the area that receives the semiconductor device chip, and are electrically connected to other terminal pads, not shown, for connection to other electrical circuitry. There may be 120 to 150 electrical terminals surrounding the area designated for receiving each semiconductor device chip 3, and they are made and electrically interconnected using techniques that are old and well known in the art.

Figure 2:
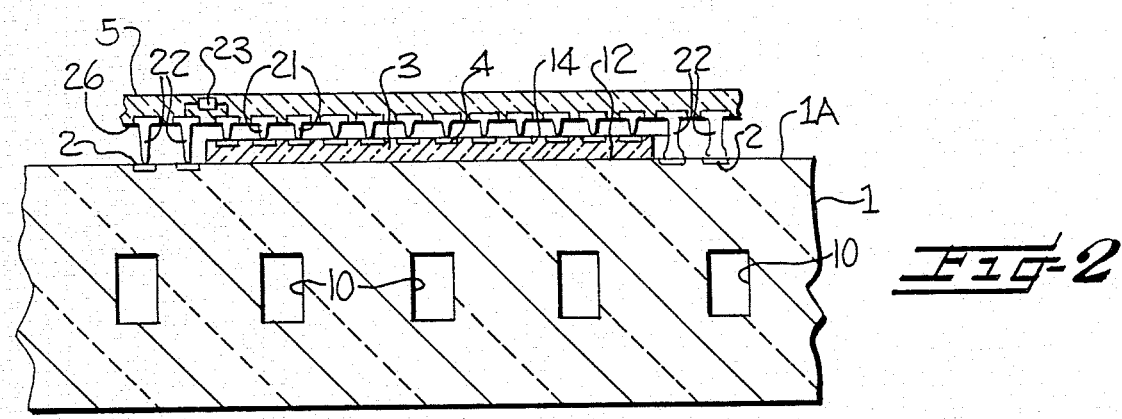
FIG. 2 is a cross-section of the apparatus of FIG. 1 taken along the line 2—2.

Referring to FIGS. 1 and 2 the semiconductor device chip 3 is typically known as a flip chip device having a first surface or backside 12 that is the substrate of the semiconductor device chip itself. The opposite or second surface 14 of the semiconductor device chip includes a plurality of electrical contact pads 4 dispersed across the surface thereof, including both the perimeter of the semiconductor device chip and the interior portions thereof, as illustrated. The contact pads are electrically connected to the device chips fabricated into the semiconductor device chip itself. There may be, for example, 120 to 150 contact pads in an area of approximately 4 to 10 millimeters squared.

The backside 12 of the semiconductor device chip 3 is in contact with the surface 1A of the substrate 1. It is typically attached or bonded in a thermally conducting relationship so that heat generated by operation of the semiconductor device chip may be dissipated through the semiconductor material of the device chip itself to the substrate 1, and ultimately carried away by the coolant circulating in the channels 10.

The means for electrically connecting the electrical terminals 2 on the substrate and the electrical pads 4 on the semiconductor device chip 3 is the translator chip 5. The translator chip base is preferably made of the same semiconductor device chip material as employed in the semiconductor device chip, although other materials may be used as circumstances require. A plurality of first electrical contacts 21 are disposed generally across the interior portion on the lower surface 26 thereof in a one-to-one correlation with the electrical pads 4 on the semiconductor device chip. Similarly, a plurality of second electrical contacts 22 are disposed generally around the perimeter of the lower surface 26 in a one-to-one correlation with the electrical terminals 2 on the upper surface of the substrate 1. As illustrated in FIG. 2, there may be multiple rows of second electrical contacts 22 from the lower surface 26 of the translator chip, depending upon the number and location of the corresponding electrical terminals 2 on the upper surface of the substrate. Also, the length of the first and second electrical contacts may differ depending upon the height of the contact pad surface 14 of semiconductor device chip 3 above the upper surface 1A of the substrate. All of the electrically conductive terminals, contacts, and pads are of the type compatible with solder joint connectors, although other means for making electrical contact are suitable.

The first and second electrical contacts 21, 22 of the translator chip 5 may be electrically connected in any predetermined circuit. For instance, each of the first electrical contacts may be connected to one and only one of the second electrical contacts. Alternatively, various ones of the first electrical contacts 21 may be interconnected among themselves, as may be various ones of the second electrical contacts 22. Still further, the translator chip may have active device chips 23 fabricated thereinto to complement the operation of the semiconductor device chip 3 located thereunder. The translator chip may have one or more levels of interconnections that carry signals from its interior to its periphery and vice-versa. This enables electrical paths to be made between the device chip 3, the translator chip 5, and the package substrate 1.

Figure 3:
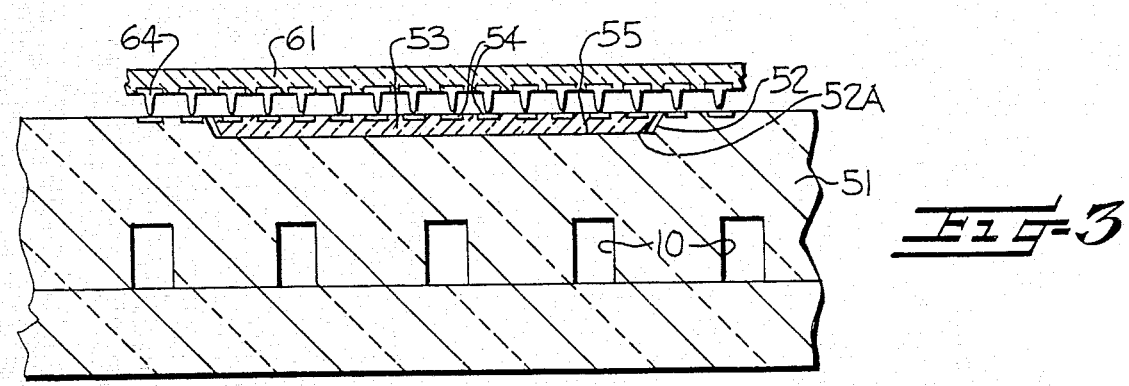
FIG. 3 is an alternate embodiment of the device chip illustrated in FIG. 2.

Referring to FIG. 3, an alternate embodiment of the invention is illustrated. The substrate 51 may have etched therein a well 52 for receiving the semiconductor device chip 53. As described earlier, the semiconductor device chip includes a plurality of electrical pads 54 dispersed across the upper surface thereof, and the backside 55 of the device chip is in contact with the bottom surface 52A of the etched well. The well is of approximately the same depth as the thickness of the semiconductor device chip so that the electrical pads on the upper surface of the device chip are generally coplanar with the electrical terminals 56 formed in the upper surface of the substrate 51.

The translator chip 61 has all of the characteristics of the one described earlier in connection with FIGS. 1 and 2, except that the first and second electrical contacts 63, 64 are of the same height due to the substantial coplanarity of the electrical pads 54 on the semiconductor device chip 53 and the electrical terminals 56 on the substrate 51.

As seen in FIGS. 1-3, the translator chip makes the electrical interconnections between the semiconductor device chip and the substrate that normally would have been made via electrical terminals and metallization patterns of electrical interconnections on the substrate itself, as typically found in a conventional mounting of a flip chip module. However, one now has the added benefits of being able to cool the inverted semiconductor device chip without the undue complications and stresses placed on a chip cooled with a piston, liquid metal, or other device chip. Other advantages include the use of the translator chip to bridge any gap between the semiconductor device chip 3, 53 and the substrate, whether the gap represents a vertical height differential, a horizontal gap between the sides of the semiconductor device chip and the sides of a well in which it is received, or a combination of both. The translator chip may also offer radiation shielding, environmental protection, and may aid in physically securing the semiconductor device chip to the substrate. Thus, it can be readily appreciated that the invention combines good thermal, electrical, and mechanical properties, all within the same configuration, and simplifies construction.

Although preferred embodiments of the invention have been described, numerous modifications and alterations would be apparent to one having ordinary skill in the art without departing from the spirit and scope of the invention.

What is claimed is:

1. Apparatus for mounting a semiconductor device chip and making electrical connections thereto, said apparatus comprising:
   a substrate having a surface including electrical terminals thereon;
   a semiconductor device chip having a first surface in contact with the surface of the substrate and a second surface having a plurality of electrical pads disposed across the surface thereof, including interior surface portions inboard of the perimeter surface portions of the semiconductor device chip; and
   means electrically connecting the substrate electrical terminals and the semiconductor device chip electricl pads, the means including a surface having a plurality of first electrical contacts disposed generally across the interior portion thereof making aerial electrical and physical contact with the semiconductor device chip electrical pads, including those interior pads disposed inboard of the perimeter surface portions of the semiconductor device chip, and a plurality of second electrical contacts disposed generally around the perimeter of the surface of the means electrically connecting and being in physical and electrical contact with he substrate electrical terminals, the first and second electrical contacts of the means being electrically connected in a predetermined circuit.

2. The apparatus of claim 1 wherein the semiconductor deice chip is a flip chip structure.

3. The apparatus of claim 1 wherein the substrate comprises a material having thermal conductive capability and the semiconductor device chip is in a thermally conducting relation therewith.

4. The apparatus of claim 3 wherein the substrate includes means for removing heat therefrom so that the substrate is a heat sink for removing heat from the semiconductor device chip.

5. The apparatus of claim 1 wherein the substrate surface defines a well for receiving a semiconductor device chip, and wherein the electrical terminals are disposed around the periphery of the well.

6. The apparatus of claim 5 wherein the well has a depth such that the contact pads of the semiconductor device chip disposed in the well are substantially coplanar with the surface of the substrate.

7. The apparatus of claim 1 wherein the semiconductor device chip second surface comprises an upper surface having a multiplicity of electrical pads disposed across substantially the entire surface thereof.

8. The apparatus of claim 1 wherein the semiconductor device chip is interposed between the surface of the substrate and the first surface of the means for electrically connecting.

9. The apparatus of claim 1 wherein the substrate comprises electrical terminals disposed immediately outside the perimeter of the semiconductor device chip.

10. The apparatus of claim 1 wherein the means for electrically connecting comprises a plurality of rows of second electrical contacts around the perimeter of the first surface.

11. The apparatus of claim 1 wherein predetermined ones of the first electrical contacts of the means for electrically connecting are electrically connected.

12. The apparatus of claim 1 wherein the first electrical contacts of the means for electrically connecting comprises a multiplicity of electrical contacts disposed across substantially the entire interior surface portion thereof.

13. The apparatus of claim 12 wherein the means for electrically connecting further comprises semiconductor device chips fabricated therein that are electrically connected to selected ones of the first and second electrical contacts of said means in a predetermined circuit.

14. The apparatus of claim 1 wherein the means for electrically connecting is superposed and substantially entirely covers the semiconductor device chip.

15. Apparatus for mounting a semiconductor device chip and making electrical connections thereto, said apparatus comprising:
   a semiconductor substrate having a surface including electrical terminals thereon, the substrate having thermal conductive capability;
   a semiconductor device chip having a first surface in contact with the surface of the substrate and being in a thermally conducting relation therewith, and a second surface having a plurality of electrical pads disposed across substantially the entire interior surface thereof, including interior surface portions inboard of the perimeter surface portions of the semiconductor device chip; and
   means electrically connecting the substrate electrical terminals immediately outside the perimeter of the semiconductor device chip and the semiconductor device chip electrical pads, the means including a first surface having a plurality of first electrical contacts disposed generally across the entire interior portion thereof making aerial electrical and physical contact with the semiconductor device chip electrical pads, including thouse interior pads disposed inboard of the perimeter surface portions of the semiconductor device chip, and a plurality of second electrical contacts disposed generally around the perimeter of the first surface of the means electrically connecting and being in physical and electrical contact with the substrate electrical terminals, and first and second electrical contacts of the means being electrically connected in a predetermined circuit.

16. The apparatus of claim 15 wherein the semiconductor device chip is a flip chip structure.

17. The apparatus of claim 15 wherein the substrate surface defines a well for receiving a semiconductor device chip.

18. The apparatus of claim 17 wherein the well has a depth such that the contact pads of the semiconductor device chip disposed in the well are substantially coplanar with the surface of the substrate.

19. The apparatus of claim 15 wherein the semiconductor device chip is interposed between the surface of the substrate and the first surface of the means for electrically connecting.

20. The apparatus of claim 15 wherein the means for electrically connecting further comprises semiconductor device chips fabricated therein that are electrically connected to selected ones of the first and second electrical contacts of said means in a predetermined circuit.

* * * * *

UNITED STATES PATENT AND TRADEMARK OFFICE
CERTIFICATE OF CORRECTION

PATENT NO.  : 4,774,630

DATED       : September 27, 1988

INVENTOR(S) : Arnold Reisman, Carlton M. Osburn, Lih-Tyng Hwang, Jagdish Narayan It is certified that error appears in the above-identified patent and that said Letters Patent is hereby corrected as shown below:

Column 5, line 52: Delete "deice" and insert -- device --.

Signed and Sealed this

Tenth Day of January, 1989

Attest:

DONALD J. QUIGG

*Attesting Officer*  *Commissioner of Patents and Trademarks*